US005486282A

United States Patent [19]
Datta et al.

[11] Patent Number: 5,486,282
[45] Date of Patent: Jan. 23, 1996

[54] ELECTROETCHING PROCESS FOR SEED LAYER REMOVAL IN ELECTROCHEMICAL FABRICATION OF WAFERS

[75] Inventors: Madhav Datta, Yorktown Heights; Ravindra Shenoy, Peekskill, both of N.Y.

[73] Assignee: IBM Corporation, Armonk, N.Y.

[21] Appl. No.: 346,996

[22] Filed: Nov. 30, 1994

[51] Int. Cl.$^6$ .................................. C25D 5/10; C25F 3/02
[52] U.S. Cl. ........................ 205/123; 205/221; 205/223; 205/238; 427/98
[58] Field of Search ............................ 205/123, 223, 205/221, 238; 427/98, 99, 103

[56] References Cited

U.S. PATENT DOCUMENTS

| | | | |
|---|---|---|---|
| 2,315,695 | 4/1943 | Faust | 204/129.85 |
| 4,174,261 | 11/1979 | Pellegrino | 204/273 |
| 4,310,403 | 1/1982 | Nitto et al. | 204/206 |
| 4,595,451 | 6/1986 | Holzer | 156/627 |
| 4,599,154 | 7/1986 | Bender et al. | 204/129.6 |
| 4,988,413 | 1/1991 | Chakravorty et al. | 205/223 X |
| 5,066,370 | 11/1991 | Andreshak et al. | 204/129.1 |
| 5,112,448 | 5/1992 | Chakravorty | 205/223 X |
| 5,152,878 | 10/1992 | Datta et al. | 204/141.5 |
| 5,167,747 | 12/1992 | Kadija | 156/345 |
| 5,227,041 | 7/1993 | Brogden et al. | 204/297 R |
| 5,228,967 | 7/1993 | Crites et al. | 204/228 |
| 5,268,072 | 12/1993 | Agarwala et al. | 156/664 |
| 5,284,554 | 2/1994 | Datta | 204/129.5 |

FOREIGN PATENT DOCUMENTS 1446026 11/1968 Germany .
60-186318 9/1985 Japan .
4-19016 1/1992 Japan .

*Primary Examiner*—Donald R. Valentine
*Attorney, Agent, or Firm*—Ratner & Prestia

[57] ABSTRACT

A tool and process for electroetching metal films or layers on a substrate employs a linear electrode and a linear jet of electrolyte squirted from the electrode. The electrode is slowly scanned over the film by a drive mechanism. The current is preferably intermittent. In one embodiment a single wafer surface (substrate) is inverted and the jet is scanned underneath. In another embodiment wafers are held vertically on opposite sides of a holder and two linear electrodes, oriented horizontally and on opposite sides of the holder, are scanned vertically upward at a rate such that the metal layers are completely removed in one pass. The process is especially adapted for fabricating C4 solder balls with triple seed layers of Ti-W (titanium-tungsten alloy) on a substrate, phased Cr-Cu consisting of 50% chromium (Cr) and 50% copper (Cu), and substantially pure Cu. Solder alloys are through-mask electrodeposited on the Cu layer. The seed layers conduct the plating current. During etching the seed layers are removed between the solder bumps to isolate them. The phased Cr-Cu and Cu layers are removed by a single electroetching operation in aqueous potassium sulfate and glycerol with cell voltage set to dissolve the phased layer more quickly than the Cu, avoiding excessive solder bump undercutting in the copper layer. The cell voltage may be such that the solder bump is only slightly undercut so as to form a stepped base C4 structure upon reflowing. Ti-W is removed by a chemical process.

5 Claims, 4 Drawing Sheets

ELECTROETCHING PROCESS FOR SEED LAYER REMOVAL IN ELECTROCHEMICAL FABRICATION OF WAFERS

BACKGROUND OF THE INVENTION

The present invention relates to electroetching of a metallic surface, and more particularly to electroetching for fabrication of C4 structures for microelectronic interconnection.

C4 is an advanced microelectronic chip packaging and connection technology. "C4" stands for Controlled Collapse Chip Connection. C4 is also known as "solder bump" and "flip chip".

The basic idea of C4 is to connect chips, chip packages, or other such units by means of solder balls partially crushed between two surfaces of the units. The tiny C4 balls of electrically conductive solder are arrayed on the surface of one unit and are pressed against metal pads on another unit to make one electrical connection at each solder ball. C4 allows all the connections to be made in one step.

A major application of C4 is in joining semiconductor microchips (integrated circuits) to chip packages. Chips usually are made in repeating rectangular arrays on a monocrystalline disc of silicon, several inches across, called a "wafer." Many chips are formed on each wafer before the chips are broken off. C4 balls are placed on terminal metals on the chips while they are still joined in a wafer. Wafers are made as large as possible so as to make the most chips at once, and the chips are made as small as possible. The best C4 fabrication system is one that makes very small, closely-spaced solder balls each precisely placed over a large area.

C4 is commercially important because it allows a very high density of electrical interconnections. C4 can be used with perimeter connection techniques, similar to tape automated bonding (TAB), but C4 connections can also be arrayed over surfaces. When an area is covered, the number of possible connections for a given size of unit is roughly squared. C4 balls are about a hundred microns in diameter and the connector density is on the order of several thousands per square inch.

C4 solder bumps must be rugged. A computer, with dozens of chips and thousands of C4 solder ball connections, can be rendered nonfunctional if only one of the C4 balls fails.

One method of fabricating the C4 solder bumps is by evaporation or vacuum deposition. In this process, terminal metals are first evaporated in a vacuum chamber and these metals are deposited on to a wafer through a metal mask. This is followed by evaporation of solder metal, which is deposited through the metal mask on top of the terminal metals. The terminal metals form the ball limiting metallurgy (BLM) and the solder metals form the solder balls.

One of the problems encountered in fabrication of C4s by evaporation is thermal mismatch due to the difference in thermal expansion of the metal mask and the wafer. This problem, combined with stringent requirements of aligning the vias in the metal mask with those on the wafer, limits the size of wafers that can be used.

An alternative C4 fabrication technique is the electrochemical fabrication of C4s. This technique requires one or more continuous conducting metal films, i.e., seed layers, for through mask electrodeposition of the solder alloy. The seed layer has a dual function: it provides a path for the electric current during electrodeposition of the solder and it becomes the ball limiting metallurgy (BLM) for the solder pads through etching.

The seed layer metallurgy and the etching processes are crucial to the electrochemical fabrication of reliable C4s. The seed layer metallurgy should be adherent to the underlying insulating layer and should have the ability to react with Sn upon reflow thereby forming an intermetallic. The etching process should yield a BLM edge profile that can sustain the stresses in the metal films and the stresses generated during intermetallic formation. During the etching process, the solder bumps remain exposed and act as masks for the underlying seed layers. The effectiveness of the etching process is judged by its ability to remove the seed layer without attacking the solder material and by its ability to provide the desired BLM pad size and BLM edge profile.

Several different seed layer metallurgies are applicable in C4 fabrication. One of the seed layer metallurgies consisting of sputter deposited titanium-tungsten (TiW)/phased chromium and copper (CrCu)/copper (Cu) layers is used. Yet another seed layer metallurgy consisting of sputter deposited chromium (Cr)/phased chromium and copper (CrCu)/copper (Cu) layers is also used. The TiW or Cr is the adhesion layer and Cu is the solderable layer that is consumed during reflow, forming an intermetallic. The phased CrCu layer prevents deadhesion.

Different dry and wet etching processes are applicable for the removal of the seed layers. Electroetching is a metal removal process where the metal layer on the wafer is made an anode in an electrochemical cell. The seed layers are removed atom by atom from the sample and the dissolved metal ions are transported into the solution. Depending on the chemistry of the metals and electrolyte salt, anode metal ions dissolved in solution either plate the cathode, fall out as precipitate, or stay in solution.

Uniformity of etching over an area is highly desirable in many electroetching operations. When fabricating C4 balls, uniformity is essential if each solder ball is to have the optimized structure. Variations in etching rate will occur, for example, to electrolyte velocity fluctuations, temperature differentials, "stray" currents, and contact resistance. Contact resistance is an ohmic-resistance problem unique to thin metal films like the seed layers of C4 fabrication. Having a small cross-sectional area, such films have appreciable resistance to the flow of electric etching currents, so voltage will be higher near the electrical contact points at the wafer's edge than at places far from a contact. As voltage drops off, the etching rate changes.

The variations resulting from these problems can cause non-uniformity of the C4 structures across an area and consequent failures, especially if the area is wide. Prior-art electroetching methods do not overcome these problems.

SUMMARY OF THE INVENTION

The present invention contemplates a tool for electroetching metallic depositions on a substrate surface. The tool comprises a chamber and pump for pressurizing an aqueous salt solution electrolyte, a nozzle assembly creating a linear jet of electrolyte, and a drive mechanism. The nozzle assembly is coupled to the chamber and pump to create the linear jet, which is disposed to impinge along an etching line parallel to the substrate surface. The drive mechanism moves the linear jet across the substrate surface in a direction generally perpendicular to the etching line and parallel to the substrate surface.

DETAILED DESCRIPTION OF THE PREFERRED EMBODIMENTS

The following terms are used throughout the specification with the following definitions:

"Function" is to be taken in the mathematical sense that a first quantity is a function of a second quantity if setting the second quantity determines the value of the first quantity. If, for two different functions, the first values are in substantially constant ratio for all values of the second quantity then the two functions are "proportional."

"Disc" means a discrete layered portion, not necessarily round or planar.

"Pad" means the same as "disc".

"Structure," in regard to C4, includes metal bumps or balls, seed layers, or bases intermediate the metal and a surface.

"Substrate" means either a top surface or a second underlying surface; it does not imply that the surface is planar or of any particular material.

"Electric power means" denotes electrical connectors for connecting a cathode and anode to a power supply, a power supply, voltmeters, timers, control circuits, rectifiers, diodes, or any and all conventional devices or techniques for placing a voltage (time-dependent or not) across an apparatus such as an electrolytic cell.

"Wettable," of a solid by a liquid, means that the liquid will tend to cover and spread over the surface of the solid.

"X-Y" means a mixture or alloy of two elemental metals X and Y, where the letters X and Y are the abbreviated chemical symbols of elements; for example, "Cr-Cu" means a mixture of chromium and copper. Elemental symbols such as Cu, Cr, Pb, Sn, Ti, and W have the standard meanings.

Electrochemical etching according to the present invention is preferably carried out by a swept linear cathode with a linear electrolyte jet, which solves the problems of contact resistance, velocity fluctuations, temperature differentials, and "stray" currents. The swept linear cathode and linear electrolyte jet ensure uniform removal of seed layer over the entire surface of wafers up to about 20 cm (about 8 inches) across. The invention contemplates at least two embodiments of the device.

Figure 1A:
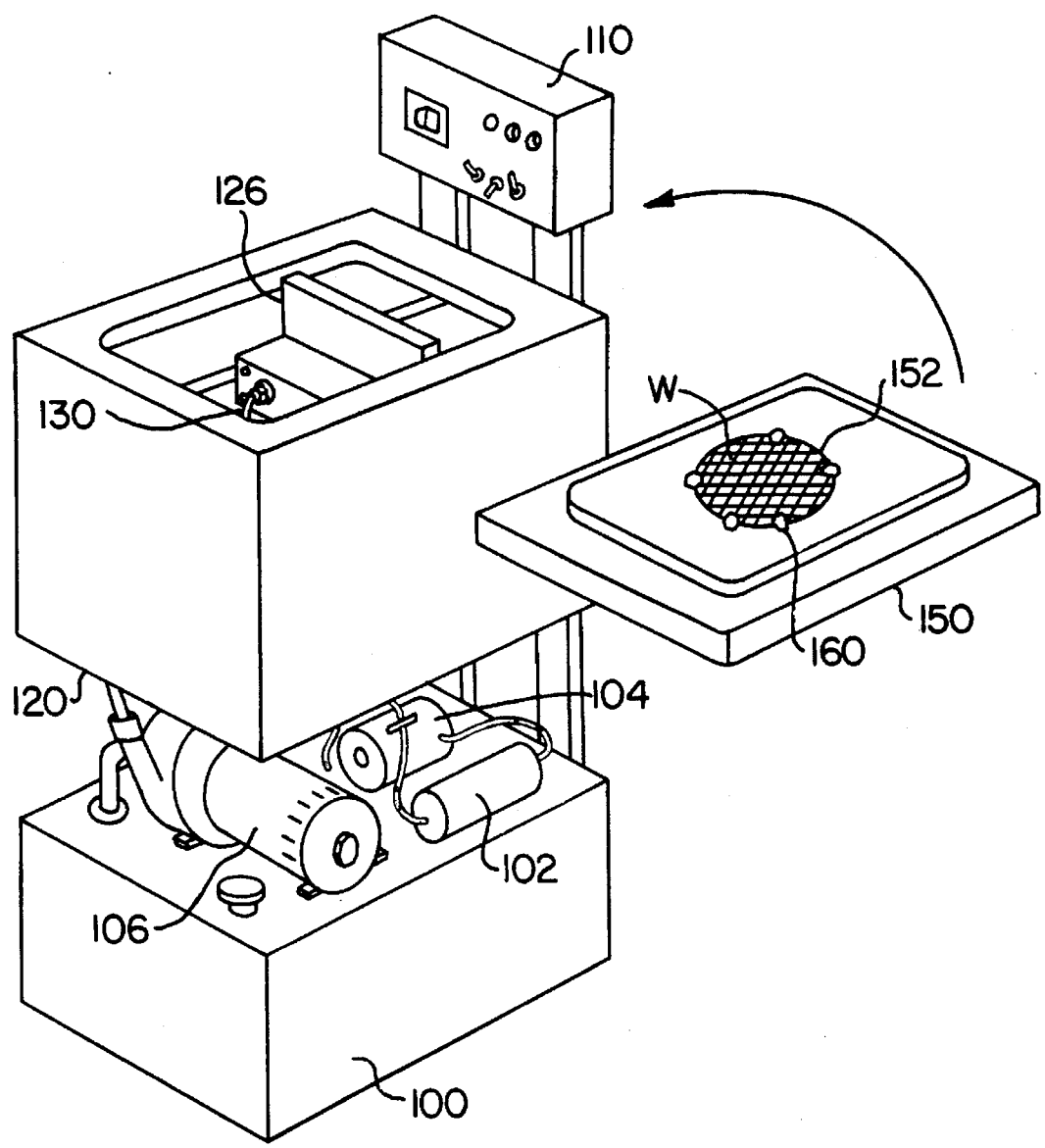
FIGS. 1a and 1b are perspective views of a horizontal-scan electroetching apparatus according to a first embodiment of the present invention.
Figure 1B:
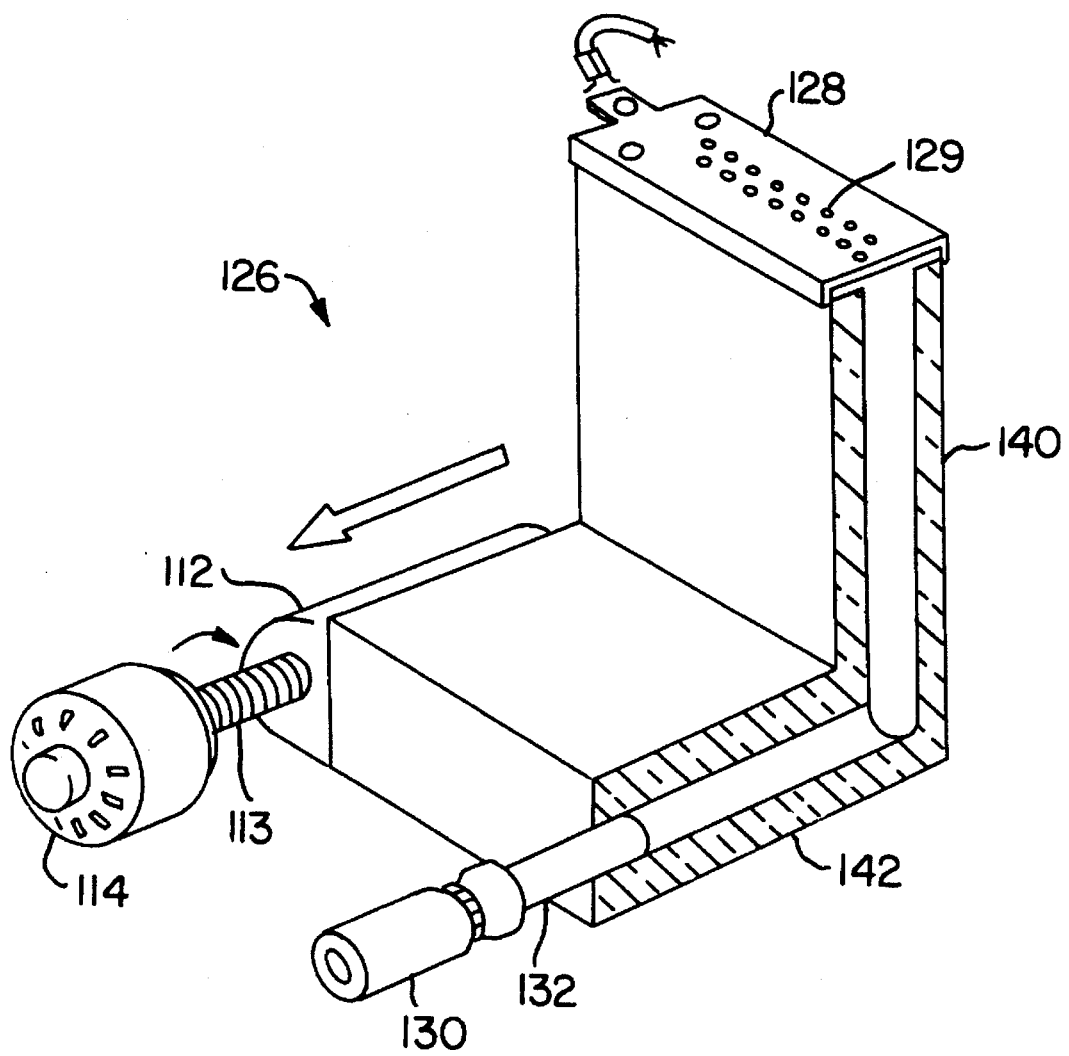

One such device for etching the Cr-Cu and Cu layers in accordance with a first exemplary embodiment of the present invention is shown in FIGS. 1a and 1b. FIG. 1a depicts the rectangular chamber 120, which contains the linear electrode and the sweep mechanism. An electrolyte reservoir 100, filter 102, filter pump 104, and nozzle pump 106 supply and clean electrolyte for the etching process. The filter pump 104 draws electrolyte draining from the chamber 120 through the filter 102 to remove metal hydroxide precipitates which are formed during electroetching. The nozzle pump 106 draws from the reservoir and pumps electrolyte through flexible hoses 130 to the L-shaped nozzle assembly 126. Above the chamber 120 is an electrical cabinet 110 containing electronic controls, power supply, etc.

The lid 150 of the chamber 120, shown removed, is fitted with a round depression 152 in which a wafer W is held. The wafer W is inserted with the solder bump side facing outward and exposed (the side that is visible in FIG. 1a). The wafer W is preferably backed up with a disc of acrylic plastic (not shown) to provide a flat surface. Clips 160 hold the wafer W in the depression and also make electrical connections to the seed layers on the surface S of the wafer W (see FIG. 4). The electrical connections, which are conventional, are not explicitly shown in FIG. 1a.

The linear cathode is shown in greater detail in FIG. 1b. The nozzle assembly 126 is fixed to a bracket 112, shown in FIG. 1b, which moves axially as threaded rod 113 is rotated by drive 114. The nozzle assembly 126 may be moved by any other conventional mechanism as well as by that shown, for example, an X-Z table. The mechanism slowly sweeps the nozzle assembly 126 as indicated by the straight directional arrow. Scanning may be either back-and-forth or uni-directional. The scan speed is adjustable, here typically between 0.05 and 0.5 cm/s.

A nozzle plate 128 is mounted atop the L-shaped nozzle assembly 126, which includes an elongated hollow vertical header 140 and a horizontal portion 142. The assembly 126 may be made of PVC or the like. The nozzle plate 128 contains two parallel central rows of through-holes 129. The interior space of the header 140, contained by the walls of the nozzle assembly 126 and the nozzle plate 128, is filled with pressurized electrolyte (not shown) through three equally-spaced fittings 132 to which are connected the flexible hoses 130 from the nozzle pump. The electrolyte spurts out through the holes 129, creating an elongated jet of electrolyte atop the nozzle plate 128. The plate 128, made of stainless steel, is about 1 inch wide and about 10 inches long, enabling it to scan over wafers 200 mm in diameter. As well as creating the linear electrolyte jet, the plate 128 acts as the cathode and is electrically connected to the power supply. The electrical connection is conventional.

When the lid 150 is placed onto the chamber the wafer surface S is adjacent the nozzle plate 128. The inter-electrode gap, that is, the distance between the upper surface of the plate 128 and the wafer surface S, is adjustable by conventional means such as a mechanism (not shown) holding the nozzle assembly 126. The inter-electrode gap is typically set between 1 and 5 millimeters. The elongated jet of electrolyte atop the nozzle plate 128 fills the space between the wafer surface S and the plate 128.

During etching the nozzle assembly 126 scans from one end of the mounted wafer W to the other while cell voltage is applied at the plate 128 and clips and the nozzle pump sends electrolyte through the holes 129. The electrolyte jet completely fills the inter-electrode gap and then runs down over the nozzle assembly 126. Etching takes place only where the electrolyte impinges, over the nozzle plate 128. The flow rate is typically between 1 and 4 gallons per minute.

Voltage can be applied either as a steady DC (direct current) or as PC (pulsating current).

Figure 2:
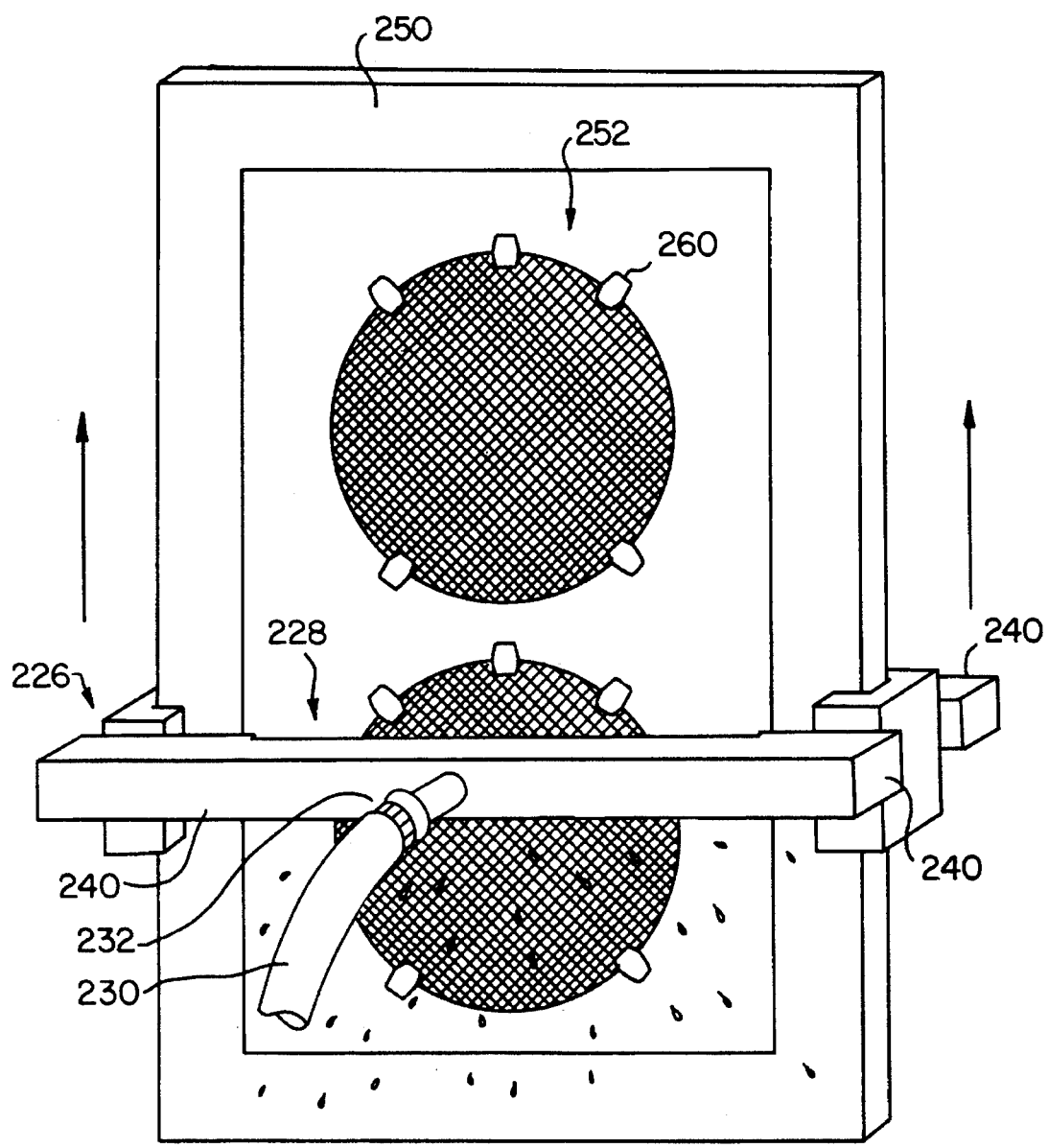
FIG. 2 is a perspective view of a vertical-scan electroetching apparatus according to a second embodiment of the present invention.

FIG. 2 shows a scanning linear electrode jet device in accordance with a second exemplary embodiment of the present invention. It differs from the embodiment of FIGS. 1a and 1b in that the wafer surface S and the scan direction are vertical rather than horizontal. A similar arrangement of reservoir, pumps, and filter is used (not shown in FIG. 2).

A nozzle assembly 226 is attached to a linear motion table or other conventional device (not shown in FIG. 2) for scanning the assembly 226. The assembly 226 includes dual headers 240 disposed on either side of a wafer holding plate 250. Each header 240 has a nozzle plate 228 with holes 229 facing inward toward the wafers W. The holes 229 are not visible in FIG. 2, and only the edge of the nozzle plate 228 can be seen, but the nozzle plates are similar to those shown in FIG. 1b.

Each side of the wafer holding plate has two round depressions 252, similar to that shown in FIG. 1a, for holding wafers W to be etched. Four wafers W are etched in one operation but more than four are possible. Clips 260, like those of the embodiment of FIG. 1a, hold the wafers W into the depressions 252 and serve as electrical contacts for the seed layers. A flexible hose 230, connected by a fitting 232 to each header 240, feeds electrolyte into the space inside the header 240 whence it leaves through the holes 229.

The motion of the linear electrolyte jet created by the assembly 226 is preferably a single pass over the wafers in an upward, rather than downward, direction. The reason for upward motion is that areas of the wafer above the scanning electrode are not wetted with electrolyte. Over a dry area there is no possibility that stray electrical currents will cause non-uniform etching. If the etching is completed in one pass (with Cu layer 6 and Cr-Cu layer 4, shown in FIG. 3, being completely removed between C4s) then etching takes places entirely within the linear jet of electrolyte spanned by the width of the nozzle plate 228. Electrolyte running down over the surface S of the wafer W in irregular patterns will not result in irregular etching because the etching has already been completed in the areas over which the electrolyte runs.

The conditions within the inter-electrode gap, for either exemplary scanned linear electrode, are ideal for uniform etching. As seen in FIG. 1b, the nozzle plate 128 is a stainless steel cathode about one inch wide with two rows of staggered holes 129 disposed along the central area. The nozzle plate 228 of the FIG. 2 embodiment has a similar structure. The holes are about 2 or 3 millimeters in diameter and spacing, and the inter-electrode gap is of the same order. With this geometry the time-average electrolyte flow will be temporally uniform along the length of the nozzle plate because of the symmetry and dimensions. As the electrode is scanned over the surface S of the wafer W, the etching action will be highly uniform.

In general, the use of a linear electrode rather than a flat or surface electrode has several advantages: stray currents can only propagate in one direction along a linear electrode, as opposed to two for a flat surface electrode, so etching is more uniform because edge effects are eliminated by the small area scan of the electrode; a thin linear electrode has a small surface area, so it reduces the total current required for the electroetching device while keeping the local current density high; if the inter-electrode gap is small or has a close tolerance, it is less expensive because a plane surface is more expensive to machine than several straight edges; and flow and current are more uniform.

The present invention, by providing headers and/or multiple hoses and by using a regular, symmetrical pattern of holes 129 or 229, insures uniform flow along the length of the linear electrolyte jets. Moreover, heat removal is better with the linear electrode of the present invention than with prior-art designs because of the short flow distance. The electrolyte does not have the opportunity to become very hot. Non-uniform etching caused by heating of the electrolyte, a problem with some prior-art uses of electroetching, cannot be a problem with the present invention because of the reduced heating and because any non-uniformities across the width of the nozzle plates 128 or 228 are canceled by the scanning.

In contrast with the prior-art Crites et al. invention (U.S. Pat. No. 5,228,967, incorporated herein by reference), the wafer holder of the present invention, used with the swept linear cathode, requires no provisions for keeping electrolyte away from the rear of the wafer, nor for preventing cracking. There is little or no turbulence and no large areas of electrolyte contact, so there is no need to protect against sudden random high pressures which will occur when large areas of the wafer are exposed to turbulence.

Unlike the housing and slot of the prior-art Andreshak et al. invention (U.S. Pat. No. 5,066,370 which is incorporated herein by reference), the nozzle plates of the present invention are symmetrical and produce symmetrical flow and etching.

The invention contemplates fabrication of C4 balls in conjunction with the electroetching tool described above. C4 balls are discussed further below.

Figure 3:
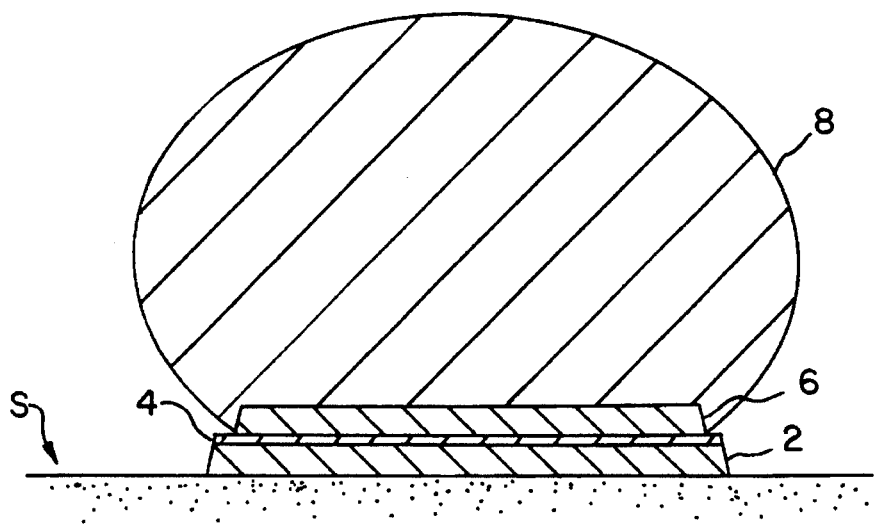
FIG. 3 is an elevational, cross-sectional view showing a C4 structure fabricated in accordance with the process of the present invention.

As shown in FIG. 3, a C4 solder ball 8 (shown in cross section) is disposed above a wafer surface S. The substrate might be polyimide, silicon (Si), quartz ($SiO_2$), ceramic, or other material. The ball 8, approximately ranging between 100 and 200 microns in diameter, is preferably composed of about 97% lead (Pb) and 3% tin (Sn). Intermediate the ball 8 and the surface S are three metallic seed layers: a layer 2 of Ti-W (titanium-tungsten alloy) adhered to the substrate, 1000 Å (0.1 micron) thick; a "phased" (heterogeneous mixture) Cr-Cu layer 4 consisting of 50% chromium (Cr) and 50% copper (Cu), 1400 Å thick; and a layer 6 of substantially pure Cu, 4300 Å thick. The thicknesses of the layers 2, 4, and 8 have been exaggerated in the drawing for clarity. The layers 2, 4, 6 preferably have the general shape of discs arranged concentrically, but may be shaped otherwise. The discs are herein also referred to as pads. The thin seed layers may conveniently be deposited on the surface S by sputtering or other vacuum methods, which create continuous metal films across the surface S.

The materials of the three seed layers 2, 4, 6 are chosen for good mutual adhesion. The Cu layer adheres well to the Pb-Sn of the solder ball 8 by forming an intermetallic of $Cu_3Sn$. Cr-Cu adheres well to Cu. Ti-W adheres well to most surfaces and to Cr-Cu. An alternate material for the layer 2 is Cr, which has good adhesion properties.

These continuous seed layers serve as a cathode during a through-mask electroplating process that deposits solder onto the Cu layer 6. The solder is electrodeposited in the form of generally cylindrical bumps which are later reflowed into balls. Through-mask electroplating allows high precision in placing the solder, even over a wide area.

The base of the C4 structure, consisting of the seed layers 2, 4, and 6, is stepped; that is, the layer 6 is of smaller diameter than the layers 2 and 4. The step helps to distribute thermal and mechanical stresses over a wider area of the brittle surface. C4 structures with stepped bases are stronger and less likely to fail than others.

In order to have a step, only two seed layers are needed. In addition to the three-layer base depicted in FIG. 4, the present invention contemplates a two-layer stepped base for a solder ball. The stepped base is formed by differential etching, as described below.

In FIG. 3, the seed layers have already been removed everywhere but under the solder ball 8. Removal is necessary if the solder balls are not to short-circuit. The phased Cr-Cu layer 4 and the Cu layer 6 are both removed in a single electroetching operation. During the joint etching of both seed layers 4 and 6, the solder, which is not eroded by the electroetching, acts as a mask to protect the regions of seed layers underneath. The Ti-W layer or Cr layer is later removed chemically, after the Cu and Cr-Cu layers have been electroetched.

The preferred electrolyte solution is aqueous 0.4 M $K_2SO_4$ and 1.5 M glycerol; differential etching rates for Cr-Cu and Cu are possible in this solution. Differential etching is used to create the stepped base of FIG. 3. The differential can be controlled because Cu and Cr-Cu exhibit different functions of dissolution rate in relation to cell voltage.

Figure 4:
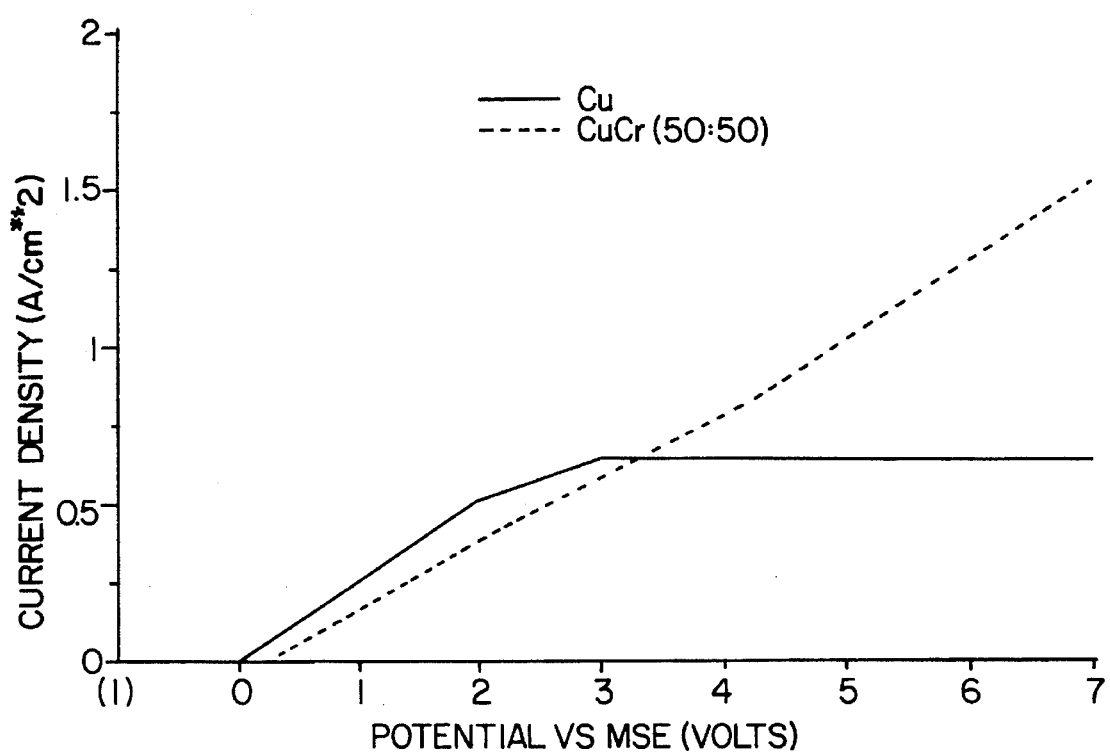
FIG. 4 is a graph plotting electroetching current density against cell voltage.

To determine the dissolution rate characteristics experiments were carried out with disc-shaped anodes rotating at 1000 rpm in aqueous 0.4 M $K_2SO_4$ and 1.5 M glycerol. Discs of Cu and Cr-Cu (50% Cu and 50% Cr) were tested, and current density was measured as a function of the cell voltage in increments of 100 mV/s. The data are shown in FIG. 4 which is a plot of current density in $A/cm^2$ against cell voltage. The current density is proportional to the metal dissolution rate, by Faraday's law of electrochemistry. The dissolution rate is also related to the dissolution valence: Cu dissolves as $Cu^{2+}$ ions, but Cr dissolves as $Cr^{6+}$ ions, so Cu atoms will leave the metal three times as fast as Cr atoms for the same current density.

The graph in FIG. 4 shows that Cu exhibits a limiting current (plateau) at more than 3 volts; this is caused by the presence of a surface salt layer (e.g., $CuSO_4$) that is formed on the metal surface. The Cr-Cu current, on the other hand, continues to increase with voltage. Because of this, Cu dissolves more quickly than Cr-Cu alloy at lower cell voltages, but more slowly than Cr-Cu at higher voltages. By varying the cell voltage, the relative rates of Cu and Cr-Cu removal in aqueous $K_2SO_4$/glycerol can be adjusted, and the ratio of the dissolution rates can be controlled.

The present invention contemplates that the ratio of dissolution rates for Cu and Cr-Cu be selected so as to achieve a proper amount of undercut in the Cu seed layer 6 during electroetching. If the amount of undercut is too great, the solder balls will rest on narrow bases and have little resistance to any lateral forces incidental to making the C4 connection, when the solder balls are partially crushed by a large normal force. If the amount of undercut is too little, the Cu disc will be the same size as the lowermost disc. In this case there will be no step to distribute stresses and the substrate is likely to crack, again causing failure. The ideal is approached when the lower disc is roughly the same diameter as the solder ball, which allows the most dense C4 packing.

To achieve the desired amount of undercut by simultaneous electroetching of two seed layers composed of Cu and Cr-Cu, the electrolytic dissolution rate of the first or lower layer 4 should be greater than the rate of the second or upper layer 6. The reason is that the edge of the Cu layer, immediately under the solder bump, is still exposed after the upper layer 6 has been removed and etching has begun on the lower seed layer 4. The edge of the Cu layer 6 will be laterally eroded during the time it takes to remove the lower layer 4 over the adjacent areas. If the lower level erodes slowly, too much time will be required.

The degree of undercut is a function of the thicknesses of the layers 4 and 6. If the lower layer 4 is quite thin, then little time will be required to etch it even if the dissolution rate of Cr-Cu is slow. Regardless of the time required to etch through the lower layer 4, some undercutting of the upper layer 6 will occur prior to exposing the lower layer because the upper layer will have a vertical edge exposed to lateral etching adjacent the solder bump while normal etching continues through the upper layer. A thick upper layer thus makes for a deep undercut. There are various factors which determine the depth of the undercut at the upper layer.

The invention contemplates that, taking into consideration other various undercut depth factors, the electrolytic cell voltage be varied to adjust the magnitudes of the etching dissolution rates of the Cu and Cr-Cu layers. By varying the cell voltage the ratio is adjusted so as to achieve a selected amount of undercut distance which has been determined as the best undercut distance for the final C4 structure. The optimum cell voltage in the realized embodiment of the invention, with the particular thicknesses described, has been found to be about 16 volts.

The combined optimum operating parameters were found to be: electrolyte 0.4 M $K_2SO_4$ and 1.5 M glycerol; cell voltage 16 volts, 10 ms on and 40 ms off; flow rate 4.00±0.02 gallons per minute; inter-electrode spacing 2 mm; and nozzle assembly scan speed 0.3 cm/s.

Preferably voltage is delivered in pulses lasting 10 ms spaced 40 ms apart (i.e., 40 ms off time between pulses). Pulsed current allows the instantaneous current to be high while the average current remains low so that the thin layers are controllably removed.

If an underlying layer 2 of Cr or Ti-W remains on the surface S after the layers 4 and 6 are removed by electroetching, it may be chemically removed. The layer 4 act as a mask to limit removal to areas outside the perimeter of layer 4.

An optimized C4 structure, which combines dense packing of solder balls with ruggedness, can be achieved by choosing seed layer metals which are differentially wetted by molten solder and by controlling the amount of undercut during electroetching, through proper selection of cell voltage.

The solder bumps are reflowed (melted) after the seed layers are etched. The cylindrical bumps then assume the generally spherical shape of the ball 8 shown in FIG. 4 while they are liquid. The rounded shape is retained when they cool into solder balls. Reflowing also causes them to melt onto the seed layer by forming intermetallics that improve adhesion.

If the seed layer is of a metal that is wetted by the molten solder, then the solder drop will tend to spread outward toward the edges of the metal disc. The seed layer metal exerts a force on the solder, caused by molecular attraction, called adhesion. If the adhesion force is great enough the solder ball will be flattened as it spreads over the pad surface.

While adhesion is pulling the molten solder drop outward, an opposing force of cohesion pulls it inward. Cohesion is molecular attraction of a substance to itself. In a liquid it causes surface tension. The surface tension in the molten solder drop tries to reduce the drop's surface area and make it spherical. If the solder does not wet the seed layer at all, the solder will ball up into an almost-perfect sphere and barely touch the surface. The force of gravity is negligible for such small droplets because the surface area-to-volume ratio is inversely related to diameter. If the two forces of adhesion and cohesion are equal, the drop will take on the hemispherical shape shown by soap bubbles on a soapy table, where surface tension pulls equally in and out.

In the present invention the Pb-Sn solder adheres to the smaller Cu disc of the upper or second seed layer, but not to the larger Cr-Cu disc of the first or lower seed layer. As a result the edge of the solder ball is at the border between Cu and Cr-Cu. The Cu disc is said to be the ball-limiting metallurgy (BLM) because it is the metal ("metallurgy") which, together with the volume of solder in the ball 8, determines the solder ball shape.

A third (adhesion or barrier) seed layer of metal may be used in conjunction with the present invention, for example, the Ti-W layer 2 depicted in FIG. 3. As mentioned above, the underlying layer 2 of Cr or Ti-W may be chemically removed, with the layer 4 acting as a mask. It cannot be removed by electroetching as it is passivated during electroetching thus making the electroetching process an "autostop" process. Removal is necessary to isolate the solder balls.

The third layer is preferably Ti-W with 10% Ti and 90% W. The preferred method of removing it (immediately after electroetching of the Cr-Cu and Cu layers 4 and 6) is immersion in a mixture of 30% by weight hydrogen peroxide and water, to which is added EDTA and potassium-sulfate. The hydrogen peroxide etches Ti-W rapidly at temperatures between 40° C. and 60° C.

The Ti-W etchant should not attack aluminum, chromium, copper, or lead-tin solders. EDTA forms a complex with tungsten to prevent plating of the Pb-Sn solder with W, and potassium sulfate forms a protective coating on the Pb-Sn solder to protect it from chemical attack.

The present invention has minimal safety and waste disposal problems. The electrochemical etching with $K_2SO_4$ and glycerol does not harm other electronic chip structures or materials. Because passivation protects the underlying Ti-W layer, damage from over-etching is impossible.

The invention makes possible inexpensive fabrication of rugged C4 structures over arbitrarily large areas and with very good dimensional tolerances over the area. It uses inexpensive equipment and lends itself to automated production. It employs well-known technologies like photolithography, electroplating, and sputtering for steps auxiliary to the invention.

In tests of the present invention, excellent uniformity of C4 structures was found over a round wafer 200 mm (8 inches) in diameter. The C4 diameter as plated was 164 microns with a standard deviation equal to 1.2% of that value. After electro-etching, the upper-layer Cu pad diameter was reduced to 147 microns with a deviation of 1.8%. In other tests, the value of three standard deviations of the pad diameters ranged from 3.7% to 6.8%.

While the invention has been described in terms of two exemplary embodiments, it is contemplated that it may be practiced as outlined above with modifications within the spirit and scope of the appended claims.

What is claimed:

1. A method of preparing wafers comprising:

depositing a metallic seed first layer composed of a first metal onto a substrate surface;

depositing a metallic seed second layer composed of a second metal onto the first layer;

depositing a metallic seed third layer composed of a third metal onto the second layer;

selectively masking areas of the surface of said third layer with masking material;

depositing a plurality of solder bumps formed on the third layer distal the first layer, each one of the plurality of bumps masking a respective one of a plurality of discrete non-contiguous regions over the substrate surface;

removing said masking material; and electroetching in an electrolyte the third seed layer and the second seed layer sufficiently to remove the third metal and the second metal from the wafer over the areas between the solder bumps;

and removing said first layer between said solder bumps.

2. The method of claim 1, wherein the first metal is Ti-W alloy, the second metal is phased Cr-Cu and the third metal is Cu.

3. The method of claim 1, wherein the electrolyte is aqueous 0.2–0.5 M $K_2SO_4$.

4. The method of claim 3, wherein the electrolyte contains 1.0–3.0 M glycerol.

5. The method of claim 4, wherein the electrolyte is aqueous 0.3–0.45 M $K_2SO_4$.

* * * * *